(12) United States Patent
Khaddam-Aljameh et al.

(10) Patent No.: US 10,896,242 B2
(45) Date of Patent: Jan. 19, 2021

(54) RESISTIVE MEMORY DEVICE FOR MATRIX-VECTOR MULTIPLICATIONS

(71) Applicant: International Business Machines Corporation, Armonk, NY (US)

(72) Inventors: Riduan Khaddam-Aljameh, Zurich (CH); Abu Sebastian, Adliswil (CH); Manuel Le Gallo-Bourdeau, Zurich (CH); Milos Stanisavljevic, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 16/289,754

(22) Filed: Mar. 1, 2019

(65) Prior Publication Data
US 2020/0279012 A1 Sep. 3, 2020

(51) Int. Cl.
G06F 17/16 (2006.01)
G11C 13/00 (2006.01)
G06G 7/161 (2006.01)
G06G 7/22 (2006.01)

(52) U.S. Cl.
CPC ............ *G06F 17/16* (2013.01); *G06G 7/161* (2013.01); *G06G 7/22* (2013.01); *G11C 13/004* (2013.01); *G11C 13/0069* (2013.01)

(58) Field of Classification Search
CPC ... G06F 17/16; G11C 13/0002; G11C 13/003; G11C 13/004; G11C 13/0069; G06G 7/16–161; G06G 7/22
See application file for complete search history.

(56) References Cited

U.S. PATENT DOCUMENTS

| 6,157,672 | A | 12/2000 | Iwata et al. |
| 7,477,095 | B2 | 1/2009 | Apfel |
| 10,534,840 | B1 * | 1/2020 | Petti ........................ G06N 3/04 |

(Continued)

FOREIGN PATENT DOCUMENTS

WO 2017/131632 A1 8/2017

OTHER PUBLICATIONS

Klavik et al., "Changing Computing Paradigms Towards Power Efficiency", Philosophical Transactions of The Royal Society, 2014, 13 pgs.

*Primary Examiner* — Matthew D Sandifer
(74) *Attorney, Agent, or Firm* — Harrington & Smith

(57) ABSTRACT

A device performs a matrix-vector multiplication of a matrix with a vector. The device includes a crossbar array having row lines, column lines and junctions arranged between the row lines and the column lines. Each junction includes a programmable resistive element and an access element for accessing the programmable resistive element. The device further includes a signal generator configured to apply programming signals to the resistive elements to program conductance values for the matrix-vector multiplication. The device further includes a readout circuit and control circuitry configured to control the signal generator and the readout circuit. The readout circuit is configured to apply read voltages having a positive voltage sign and negative read voltages having a negative voltage sign to the row lines of the crossbar array. The readout circuit is further configured to read out column currents of the plurality of column lines of the crossbar array.

20 Claims, 7 Drawing Sheets

(56) References Cited

U.S. PATENT DOCUMENTS

| | | |
|---|---|---|
| 10,739,186 B2 * | 8/2020 | Hatcher .................. G06G 7/16 |
| 2015/0170025 A1 | 6/2015 | Wu et al. |
| 2017/0228345 A1 * | 8/2017 | Gupta .................... G06F 17/16 |
| 2018/0004708 A1 | 1/2018 | Muralimanohar et al. |
| 2019/0154493 A1 * | 5/2019 | Hatcher ................. G11C 11/54 |
| 2020/0265892 A1 * | 8/2020 | Hatcher ............. G11C 13/0069 |

* cited by examiner

Averaged on *K* devices

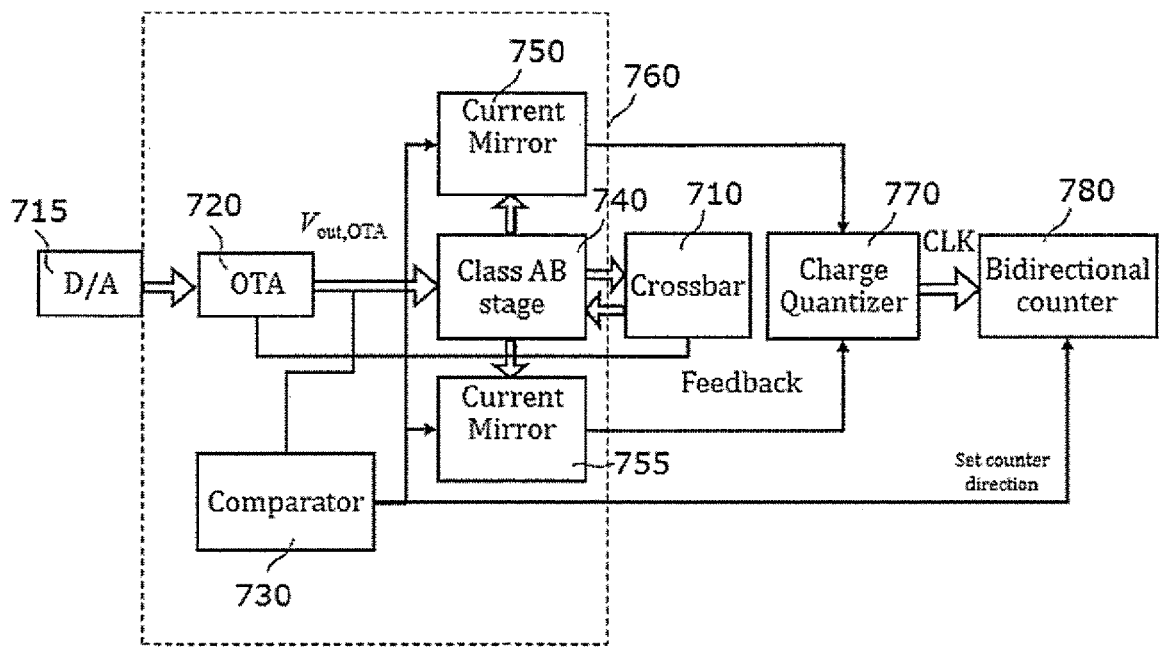
FIG. 7     700
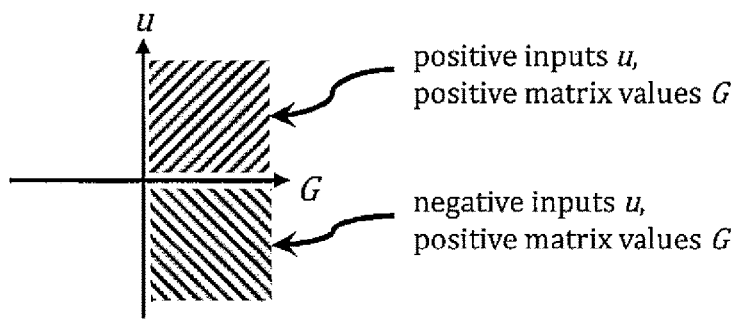
FIG. 8a
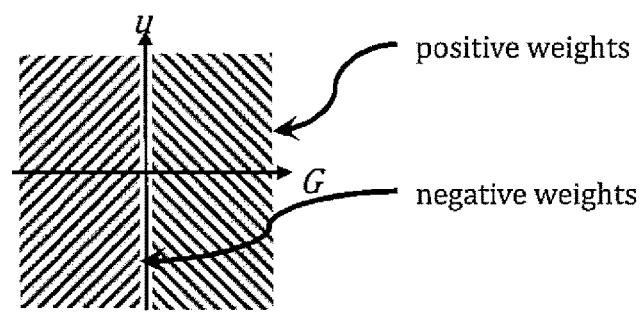
FIG. 8b     800

900

1000

RESISTIVE MEMORY DEVICE FOR MATRIX-VECTOR MULTIPLICATIONS

BACKGROUND

Cognitive computing is a promising technology for deriving intelligence and knowledge from huge volumes of data. Today's cognitive computers are usually based on the Von Neumann architecture in which the computing and the memory units are separated. Cognitive computing is inherently data-centric, meaning that huge amounts of data need to be shuttled back and forth at high speeds. As the Von Neumann architecture is rather inefficient for such a task, it is becoming increasingly clear that other architectures are desired to build efficient cognitive computers, in particular architectures where memory and logic coexist in some form.

Memcomputing is a key non-Von Neumann approach being researched. A key element in this novel computing paradigm is a high-density, low-power, variable state, programmable and non-volatile memory device.

A fundamental computational primitive is a matrix-vector multiplication. This primitive is of particular interest as it forms the basis of several linear algebraic operations and it is one of the most commonly used mathematical operations in science and engineering. A matrix is usually represented by a two-dimensional array of matrix elements and a vector by a one-dimensional array of vector elements. A matrix may be considered as array of vectors. Hence a matrix-vector multiplication can be generalized to a matrix-matrix multiplication and to a vector-vector multiplication.

One particular challenge is to extend the range of multiplied numbers to cover values smaller than zero.

SUMMARY

According to a first aspect, a device for performing a matrix-vector multiplication of a matrix with a vector comprises a crossbar array comprising a plurality of row lines, a plurality of column lines and a plurality of junctions arranged between the plurality of row lines and the plurality of column lines. Each junction comprises a programmable resistive element and an access element for accessing the programmable resistive element. The device further comprises a signal generator configured to apply programming signals to the resistive elements to program conductance values for the matrix-vector multiplication. The device further comprises a readout circuit and control circuitry configured to control the signal generator and the readout circuit. The readout circuit is configured to apply positive read voltages having a positive voltage sign and negative read voltages having a negative voltage sign to the plurality of row lines of the crossbar array. The readout circuit is further configured to read out column currents of the plurality of column lines of the crossbar array. The column currents may have a positive current sign corresponding to a positive current direction or a negative current sign corresponding to a negative current direction. The readout circuit is further configured to perform a bidirectional charge counting of the column currents in dependence on the current direction of the column currents.

According to another aspect, a method for performing a matrix-vector multiplication of a matrix with a vector comprises providing a crossbar array comprising a plurality of row lines, a plurality of column lines and a plurality of junctions arranged between the plurality of row lines and the plurality of column lines. Each junction comprises a programmable resistive element and an access element for accessing the programmable resistive element. The method further comprises applying, by a signal generator, programming signals to the resistive elements. Thereby conductance values are programmed for a subsequent matrix-vector multiplication. The method further comprises applying, by a readout circuit, simultaneously positive read voltages having a positive voltage sign and negative read voltages having a negative voltage sign to the row lines of the crossbar array. The method further comprises reading out, by the readout circuit, column currents of the plurality of column lines of the crossbar array, the column currents having a positive current sign corresponding to a positive current direction or a negative current sign corresponding to a negative current direction. In addition, the method comprises performing, by the readout circuit, a bidirectional charge counting of the current of the column lines in dependence on the sign of the column currents.

According to another aspect a design structure is provided. The design structure is tangibly embodied in a machine readable medium for designing, manufacturing, or testing an integrated circuit. The design structure comprises a device according to the first aspect.

Embodiments will be described in more detail below, by way of illustrative and non-limiting examples, with reference to the accompanying drawings.

BRIEF DESCRIPTION OF THE SEVERAL VIEWS OF THE DRAWINGS

FIG. 7 shows a functional block diagram illustrating schematically the function of another device for performing a matrix-vector multiplication of a matrix with a vector according to an embodiment;

FIG. 8a shows an exemplary input voltage/matrix value diagram illustrating a first approach for performing a matrix-vector multiplication according to embodiments;

FIG. 8b shows an exemplary input voltage/matrix value diagram illustrating a second approach for performing a matrix-vector multiplication according to embodiments;

DETAILED DESCRIPTION

In reference to FIGS. 1-11, some general aspects and terms of exemplary embodiments are described.

According to exemplary embodiments, a resistive element may be defined as an element whose electrical resistance can be changed by applying an electrical programming signal to the resistive element. The resistive element may be in particular embodied as resistive memory element. The electrical programming signal may be e.g. a current flowing through the resistive memory element, or an electrical voltage applied to the resistive memory element. The current and/or voltage may be e.g. applied to the resistive memory element in the form of pulses. As a result, the electrical resistance of a resistive memory element depends on the history of current that had previously flown through the memory element and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g. a chalcogenide. These resistive memory elements exhibit good performance in terms of power consumption, integration density potential, retention, and endurance.

Embodiments described herein provide a way to do inexact fast matrix multiplications. The result from this multiplication may preferably be used in algorithms that do not require high precision for multiplication tasks. Such an algorithm that could be used for the post-processing of the results of the multiplication is e.g. the algorithm disclosed by Klavik et al. in "Changing Computing Paradigms Towards Power Efficiency", Proc. Royal Society A., 2014. The multiplication performed can be fast, low-power and may be scalable to matrix sizes of 10000×10000 and beyond.

Embodiments described herein may bring significant power and/or speed advantages compared to the conventional Von-Neumann approach where the data has to be shuttled back and forth between a processor or central processing unit (CPU) and the memory.

As a matrix-vector multiplication can be generalized to a matrix-matrix multiplication and to a vector-vector multiplication, the device and the methods described herein can also be used to perform matrix-matrix multiplications and vector-vector multiplications.

Figure 1:
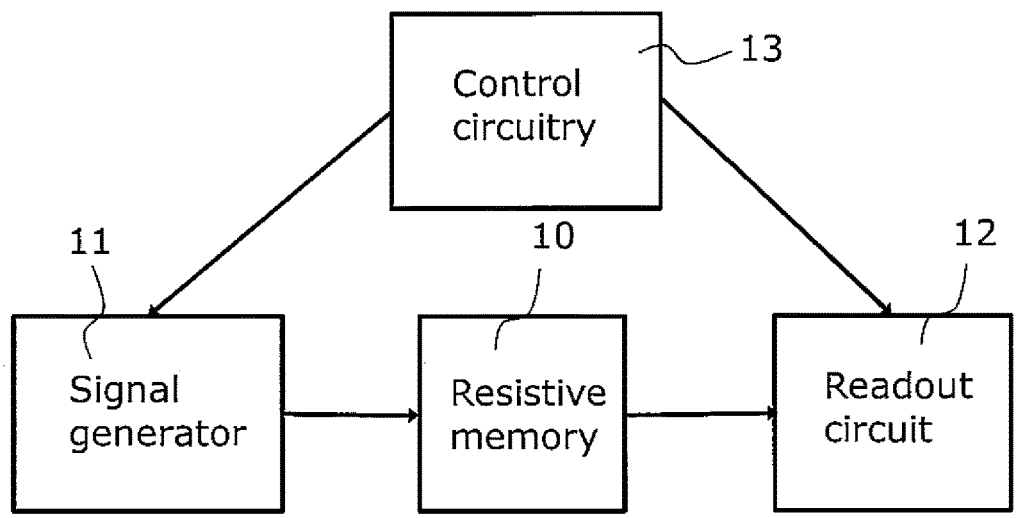
FIG. 1 is a simplified schematic block diagram of a device for performing a multiplication of a matrix with a vector according to an exemplary embodiment.

FIG. 1 is a simplified schematic block diagram of a device 100 for performing a multiplication of a matrix with a vector. The device 100 comprises a resistive memory 10 having a plurality of resistive memory elements. Furthermore, a signal generator 11 is provided. The signal generator 11 is configured to apply electrical programming signals to the resistive memory elements of the resistive memory 10. The signal generator 11 comprises circuitry for programming the resistive memory cells during data write or programming operations such that a multiplication of a matrix with a vector can be performed. The row lines and column lines may also be denoted as word and bit lines. The signal generator 11 is configured to receive a matrix A as input and to apply programming signals to the resistive memory elements to program conductance values of the resistive memory elements for a matrix-vector multiplication.

The conductance values represent matrix values of the matrix that shall be multiplied with the vector.

In addition, the device 100 comprises a readout circuit 12 configured to read out resistance values of the resistive memory elements during data read operations. The device 100 is configured to apply read out voltages to the rows of the memory crossbar array. The read out voltages represent vector elements of the vector that shall be multiplied with the matrix. The device is further configured to read out current values of columns of the memory array. The current values represent result values of vector elements of a result vector of the multiplication.

The device 100 further comprises control circuitry 13 configured to control the signal generator 11 and the readout circuit 12.

The memory 10 may be generally any kind of resistive memory as described above. In particular it may be a phase change memory (PCM) or a resistive random access memory (RRAM). In the following it assumed that the resistive memory 10 is embodied as PCM. Accordingly the resistive memory 10 comprises a plurality of PCM cells as resistive memory elements. The PCM cells of memory 10 may comprise s=2 or s>2 programmable resistance states, the latter providing multilevel operation. The s programmable resistance-states correspond to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the crystalline phase within the otherwise amorphous PCM material. The s programmable cell-states are typically defined in terms of predetermined reference values, or ranges of values, of the resistance metric used for read detection by the readout circuit 12.

To perform a matrix-vector multiplication, the PCM cells are programmed according to embodiments in a kind of write operation. More particularly, the signal generator 11 applies a voltage to the cell via the column lines and row lines such that the resulting programming signal sets the cell to a state (conductance value) that represents a matrix element of the matrix that shall be multiplied with the vector. In a read operation, (lower) read voltages are applied to the row lines. Then the resulting column current values of the column lines are read/measured to obtain the result vector.

Figure 2:
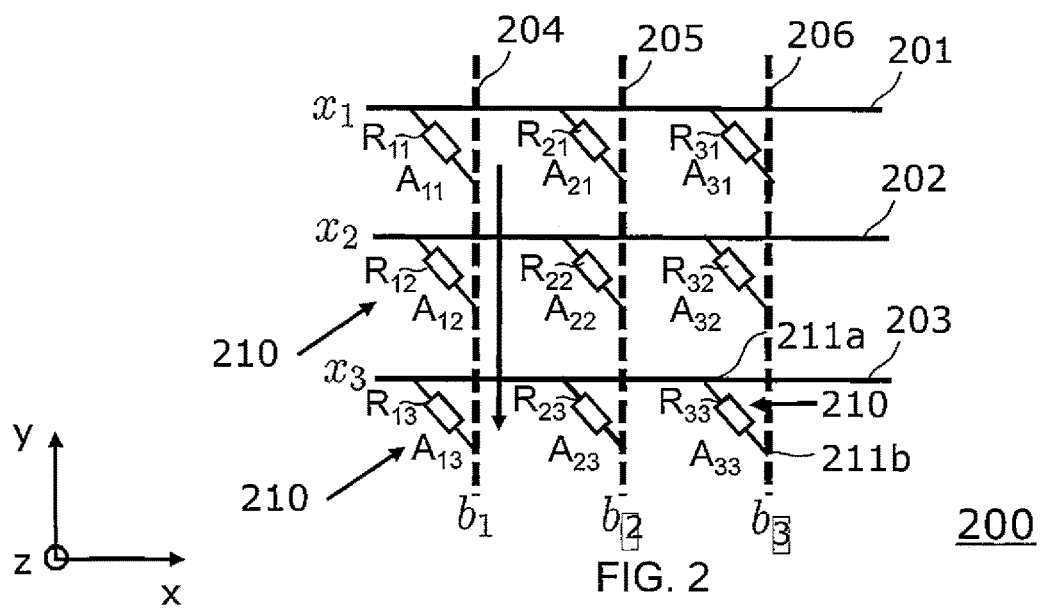
FIG. 2 illustrates an example of matrix-vector multiplication according to an exemplary embodiment.

FIG. 2 illustrates an example of a matrix multiplication. The matrix multiplication uses Ohm's law and Kirchhoff's law in a resistive memory crossbar array.

According to the illustrated example, a matrix A of size 3×3 shall be multiplied with a vector x and the result is a product or result vector b:

$$\begin{bmatrix} A_{11} & A_{12} & A_{13} \\ A_{21} & A_{22} & A_{23} \\ A_{31} & A_{32} & A_{33} \end{bmatrix} \begin{bmatrix} x_1 \\ x_2 \\ x_3 \end{bmatrix} = \begin{bmatrix} b_1 \\ b_2 \\ b_3 \end{bmatrix}$$

Accordingly, the matrix A comprises a first column consisting of the matrix elements $A_{11}$, $A_{21}$ and $A_{31}$, a second column consisting of the matrix elements $A_{12}$, $A_{22}$ and $A_{32}$ and a third column consisting of the matrix elements $A_{13}$, $A_{23}$ and $A_{33}$. The vector x comprises the vector elements $x_1$, $x_2$ and $x_3$.

For such a multiplication of the matrix A with the size 3×3, the resistive memory 10 comprises a memory crossbar array 200 of a corresponding size 3×3.

The memory crossbar array 200 comprises 3 row lines 201, 202 and 203 and three column lines 204, 205 and 206. The three row lines 201, 202 and 203 are arranged above the three column lines 204, 205 and 206 which is indicated by dotted lines. More particularly, the row lines 201, 202 and 203 extend in a first x-y-plane and the three column lines extend in a second x-y plane, wherein the first x-y plane is arranged in the vertical z-direction above the second x-y-plane.

The three row lines 201, 202 and 203 and the three column lines 204, 205 and 206 are connected to each other via vertical junctions 210. The junctions 210 extend in the vertical z-direction between upper cross points 211a of the row lines 201-203 and lower cross points 211b of the column lines 204-206.

Each junction 210 comprises a serial arrangement of a resistive memory element and a transistor. For ease of illustration, the transistors are not shown in FIG. 2.

More particularly, the crossbar array 200 comprises 9 resistive memory elements embodied as PCM cells. The column line 204 comprises resistive memory elements $R_{11}$, $R_{12}$ and $R_{13}$, the column line 205 comprises the memory elements $R_{21}$, $R_{22}$ and $R_{23}$ and the column line 206 the memory elements $R_{31}$, $R_{32}$ and $R_{33}$.

In order to perform the matrix vector multiplication of the above matrix, the signal generator 11 applies programming signals, in particular current pulses, to the resistive memory elements and thereby programs the conductance values for the matrix-vector multiplication.

More particularly, the conductance values of the resistive memory elements represent matrix values of the matrix of the matrix-vector multiplication. Accordingly, the conductance of the resistive memory element $R_{11}$ is programmed to the matrix value $A_{11}$, the conductance of the resistive memory element $R_{12}$ is programmed to the matrix value $A_{12}$, or more generally the conductance of the resistive memory Rij is programmed to a corresponding matrix value Aij.

Then the readout circuit 12 applies read voltages to the row lines 201, 202 and 203. More particularly, the readout circuit 12 applies a read voltage $X_1$ to the row line 201, a read voltage $X_2$ to the row line 202 and a read voltage $X_3$ to the row line 203. Hence the read voltages represent vector values of the vector of the matrix-vector multiplication.

Furthermore, the readout circuit 12 reads out current values of the column lines 204, 205 and 206. As an example, the readout circuit 12 reads out a current value $b_1$ from the column line 204, which is the sum of three multiplications, namely $$b_1 = A_{11}x_1 + A_{12}x_2 + A_{13}x_3.$$

Accordingly, the readout circuit 12 reads out a current value $b_2$ from the column line 205 and a current value $b_3$ from the column line 206. The current values represent the result values of the vector elements of the product vector b.

Figure 3:
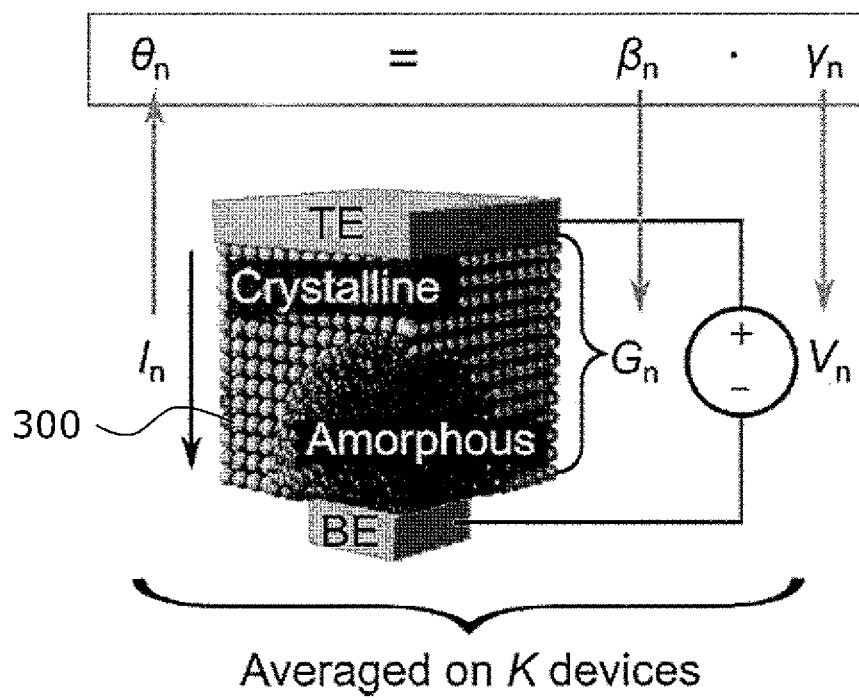
FIG. 3 illustrates an exemplary embodiment of a scalar multiplication to be performed by a phase change memory cell.

FIG. 3 illustrates an exemplary embodiment of a scalar multiplication that may be performed by a PCM cell 300. Such a scalar multiplication forms the basis of the matrix-vector multiplication performed according to embodiments described herein. Let $\theta_n = \beta_n \cdot \gamma_n$, where $\beta_n$ and $\gamma_n$ are numbers generated uniformly in [0,1]. $\beta_n$ is mapped to an effective conductance $G_n$, and $\gamma_n$ to a voltage $V_n$. As the current in the PCM cell 300 is a slightly non-linear function of the voltage, the analogue scalar multiplication may be expressed to follow a "pseudo" OHM's law, namely by $$I_n \cong \alpha G_n \cdot f(V_n).$$

In this equation, $\alpha$ is a time dependent conductance variation parameter and f a function, in particular a polynomial function that approximates the current-voltage characteristics of the PCM cell 300. The PCM cell 300 may be programmed to the effective conductance $G_n$ by an iterative program and verify procedure. Then the readout circuit 12 may apply a read voltage $V_n$ and readout the current $I_n$. Finally, the current $I_n$ is converted back to approximate the value $\theta_n$, representing the result of the scalar multiplication.

According to preferred embodiments, an averaging of the result over K memory elements/PCM cells is performed.

Figure 4:
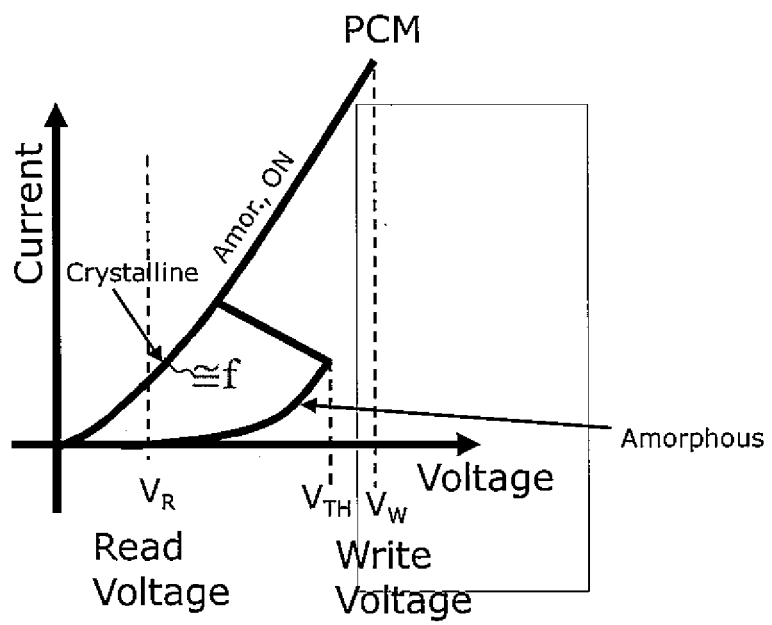
FIG. 4 is a schematic illustration of the current/voltage characteristics of the material components of the phase change memory cell of FIG. 3.

FIG. 4 is a schematic illustration of the current/voltage (and hence resistance) characteristics of the material components of the memory cell 300 of FIG. 3. The solid lines indicate variation of current with voltage for the PCM material, starting from the fully-crystalline SET state (upper curve) and also the fully-amorphous RESET state (lower curve). These two curves reflect the large (typically 3 orders of magnitude) variation in resistivity between the crystalline and amorphous phases. The amorphous phase exhibits a non-linear characteristic with a threshold switching phenomenon that is field induced. At a certain threshold voltage $V_{TH}$, this phase switches to a very low "ON-state" resistance corresponding to that of the crystalline PCM material. The cell programming (write) voltage is selected to be above this threshold voltage as indicated.

As can be seen in FIG. 4, the current in the read mode is a slightly non-linear function of the voltage.

Figure 5:
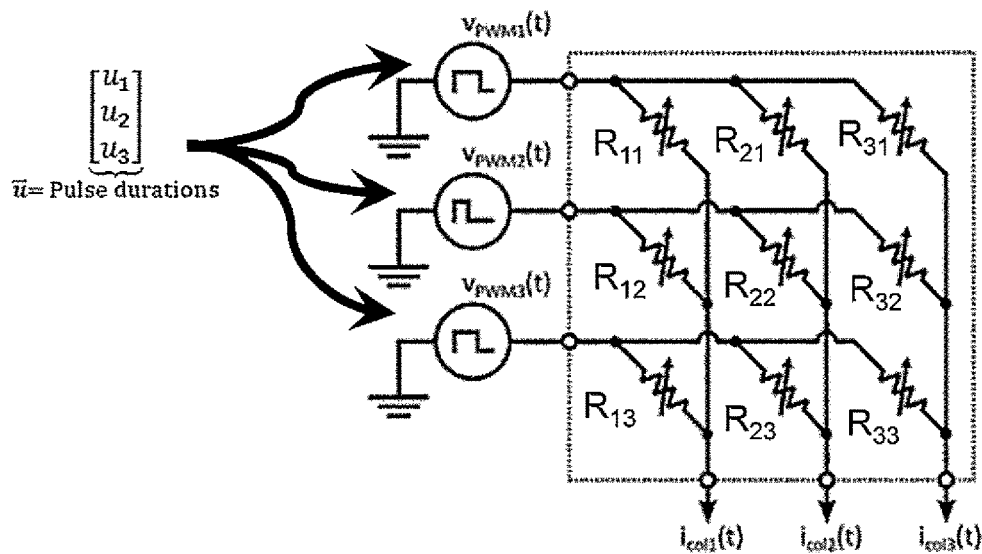
FIG. 5 illustrates the application of read voltages to a crossbar array according to an exemplary embodiment.

FIG. 5 illustrates the application of read voltages to a crossbar array according to one exemplary embodiment. According to this embodiment, the application of the input vector happens through read voltage pulse modulation. The elements of the input vector $$\vec{u}$$

are mapped to pulse durations of read pulses. More particularly, the amplitude of the applied read voltages $V_{PWM1}(t)$, $V_{PWM2}(t)$ and $V_{PWM3}(t)$ is fixed, while the width of the read pulses is modulated in dependence on the respective read voltage. This provides the advantage that non-linearities in the current voltage (IV curve) of the resistive elements of the crossbar array are avoided. At the output of the column lines, column current signals $i_{col1}(t)$, $i_{col2}(t)$ and $i_{col3}(t)$ are detected, in particular integrated.

Figure 6:
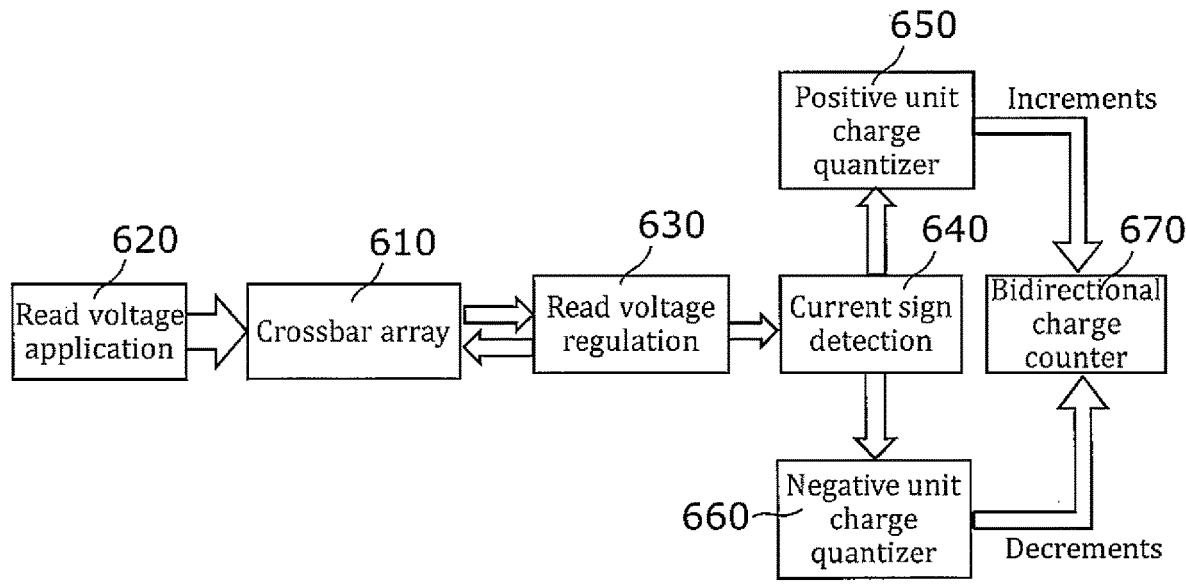
FIG. 6 shows a functional block diagram illustrating schematically the function of a device for performing a matrix-vector multiplication of a matrix with a vector according to an exemplary embodiment.

FIG. 6 shows a functional block diagram illustrating schematically the function of a device 600 for performing a matrix-vector multiplication of a matrix with a vector according to an example embodiment. The device 600 comprises a crossbar array 610 and is configured to apply simultaneously positive read voltages and negative read voltages to row lines of the crossbar array 610.

The positive read voltages have a positive sign and the negative read voltages have a negative sign. As an example, for a matrix with 3 row lines and 2 column lines this may be expressed as follows, assuming a PWM read voltage with a fixed amplitude $V_{read}$:

$$\begin{bmatrix} G_{11} & G_{12} \\ G_{21} & G_{22} \\ G_{31} & G_{32} \end{bmatrix} \times \begin{bmatrix} V_{read} * u_1 \\ -V_{read} * u_2 \end{bmatrix} = \begin{bmatrix} q_1 \\ q_2 \\ q_3 \end{bmatrix} \text{ with } (u, q \in [-\infty, \infty])$$

This corresponds or in other words may be rewritten to $$\begin{bmatrix} G_{11} & G_{12} \\ G_{21} & G_{22} \\ G_{31} & G_{32} \end{bmatrix} \times \begin{bmatrix} u_1 \\ -u_2 \end{bmatrix} \times V_{read}$$

The latter formula corresponds to or may be rewritten to $$\underbrace{\begin{bmatrix} G_{11} & G_{12} \\ G_{21} & G_{22} \\ G_{31} & G_{32} \end{bmatrix} \times \begin{bmatrix} u_1 \\ 0 \end{bmatrix} \times V_{read}}_{\text{Multiplication with positive inputs}} - \underbrace{\begin{bmatrix} G_{11} & G_{12} \\ G_{21} & G_{22} \\ G_{31} & G_{32} \end{bmatrix} \times \begin{bmatrix} 0 \\ |u_2| \end{bmatrix} \times V_{read}}_{\text{Multiplication with negative inputs}}$$

Hence such a matrix-vector multiplication with positive and negative inputs may be split into a subtraction of 2 matrix-vector multiplications. By introducing negative inputs, the matrix multiplication operation becomes more versatile. The result of the multiplication can now be a negative amount of charge.

The device 600 comprises a read voltage application unit 620. According to some embodiments, the read voltage application unit 620 may be embodied as pulse width modulation (PWM) unit configured to convert the read voltages to be applied to the crossbar array 610 into a pulse-width-modulated signal. According to other embodiments, the read voltage application unit 620 may be embodied as binary pulse generator configured to apply the read voltages as binary read pulse vectors to the row lines of the crossbar array.

The device 600 further comprises a voltage regulation unit 630 which is configured to perform a regulation of the applied read voltage. The device 600 further comprises a detection circuit 640 which is configured to detect the instantaneous current direction of the column currents supplied to each column line of the crossbar array 610.

In dependence on the instantaneous sign of the respective column current, the device 600 activates or in other words triggers a first charge quantization circuit 650 or a second charge quantization circuit 660. The first charge quantization circuit 650 may also be denoted as first unit charge quantizer 650 and the second charge quantization circuit 660 may be denoted as second unit charge quantizer 660. The first unit charge quantizer 650 is configured to quantify the charge in a positive current direction of the column currents which may also be denoted as first current direction. The second unit charge quantizer 660 is configured to quantify the charge in a negative current direction of the column currents, which may also be denoted as second current direction. Furthermore, the device 600 comprises a bidirectional charge counter circuit 670 configured to perform a bidirectional counting of the charge/decharge cycles of the first unit charge quantizer 650 and the second unit charge quantizer 660.

Assuming a PWM based application of input pulses, the current supplied to the crossbar will be either monotonously rising or falling. Accordingly, there is only one sign change to be detected. On detection, the charge counter circuit inverts its direction and starts decreasing the amount of quantified charge.

FIG. 7 shows a functional block diagram illustrating schematically the function of a device 700 for performing a matrix-vector multiplication of a matrix with a vector according to an example embodiment.

The device 700 comprises a crossbar array 710 and is configured to apply simultaneously positive read voltages and, negative read voltages to row lines of the crossbar array 710. The device 700 comprises a digital-to analog (D/A) converter 715 and an operational transconductance amplifier (OTA) 720. The digital-to analog (D/A) converter 715 converts a digital input signal, in particular a digital input vector and digital matrix values, into an analog input signal.

The digital values of the matrix are mapped to the conductance property of the resistive elements representing the matrix.

The operational transconductance amplifier 720 is configured to supply positive column currents having a positive sign as well as negative column currents having a negative sign to the crossbar array 710. The positive column currents correspond to a first or positive current direction and the negative column currents correspond to a second or negative current direction opposite to the first current direction. The device 700 further comprises a comparator 730 as detection circuit which is configured to use a control output of the OTA 720 to detect the sign of the column current which flows into the respective columns of the crossbar array 710.

The device 700 further comprises an amplifier stage 740 embodied as class AB amplifier stage which is arranged between the OTA 720 and the crossbar array 710. The device 700 further comprises a first current mirror 750 and a second current mirror 755 which are configured to copy the current flowing via the class AB amplifier stage 740 to the crossbar array 710. More particularly, the first current mirror 750 is configured to copy the positive column currents and the second current mirror 755 is configured to copy the negative column currents.

The OTA 720, the comparator 730, the class AB amplifier 740, the first current mirror 750 and the second current mirror 755 form a read voltage regulation circuit 760 which supplies the column currents to the crossbar array 710.

The device 700 further comprises a charge quantization circuit 770 which receives the positive column currents from the first current mirror 750 and the negative column currents from the second current mirror 755. The charge quantization circuit 770 performs a quantization of the column currents of the plurality of column lines in terms of number of unit charges. In other words, the charge quantization circuit 770 is configured to perform a charge quantization of unit charges of the column currents of the plurality of column lines. A unit charge may be defined as a predefined amount of charge.

According to some embodiments, the charge quantization circuit 770 may be a time-based current analog-to-digital converter which is configured to emit a pulse on detection of a unit charge and to provide the pulse e.g. as clock or pulse signal CLK to a charge counter circuit 780. The unit charge may be denoted with $Q_{LSB}$. The charge counter circuit 780 is configured to perform a bidirectional counting of the pulses and thereby a counting of the unit charges being quantized by the charge quantization circuit 770. The charge counter circuit 780 receives the sign of the respective column current from the comparator 730 and may set the counter direction accordingly. The charge counter circuit 780 may then perform a bidirectional counting of the received pulses and may in dependence on the received sign information increment or decrement the stored counter value.

The charge quantization circuit 770 may comprise e.g. one or more integration capacitors which are charged by the column currents and de-charged during a plurality of charge/decharge cycles. The charge quantization circuit 770 may then provide a pulse signal per charge/decharge cycle to the charge counter circuit 780 and the charge counter circuit 780 may then count the plurality of charge/decharge cycles.

According to embodiments, each column of the crossbar array 710 may have one charge quantization circuit 770. This provides maximum parallelization.

Systems according to the exemplary embodiments described herein may establish a non-von-Neumann matrix-vector multiplication accelerator running at O(1) complexity with respect to the dimensions in the multiplied matrix and vector.

The crossbar array of systems according to the described embodiments may comprise as resistive elements Phase change memory (PCM) elements, Conductive bridge resistive memory elements, Metal-oxide resistive random access memory (RRAM) elements, Magneto-resistive random access memory (MRAM) elements, Ferroelectric random access memory (FeRAM) elements, optical memory elements or a system device, comprising transistors, resistors, capacitors, and/or inductors, jointly emulating a behavior of a resistive memory element.

Embodiments described herein support negative values in the matrix as well as in the input vector by facilitating the flow of negative currents in the crossbar array.

As mentioned, the digital input signal consists of a digital input vector, which is to be multiplied with the values stored in the resistive elements of the crossbar array. For that the N×1 digital input vector may comprise N numbers with x bits which is converted to an analog quantity to allow the O(1) complexity style multiplication.

This may be implemented according to embodiments in several ways.

According to a first embodiment, devices, e.g. the devices 100, 600 and/or 700, may be configured to apply the read voltages as pulse-width-modulated signals to the row lines of the crossbar array. Using pulse-width-modulation (PWM), the x bit input values are converted to pulses of duration 0 to $2^{(x-1)}$ times a clock cycle. The currents to be measured in the PWM case are non-constant and vary with time. According to such an embodiment the charge quantization circuit may cope with successive sign changes during the period while maintaining high accuracy. This may be achieved according to embodiments by a synchronous bidirectional charge counter circuit. The bidirectional charge counter circuit may comprise in particular integration capacitors, which may have a variable bottom electrode potential.

According to a second embodiment, devices, e.g. the devices 100, 600 and/or 700, may be configured to apply the read voltages as binary read pulse vectors to the row lines of the crossbar array. According to such an embodiment, the devices may comprise in particular an asynchronous charge counter circuit.

Using binary D/As the x bit input value can be mapped to a sequence of x binary read pulse vectors which are applied to the crossbar array from which x currents are read, digitized and added thus yielding the result of the matrix-vector multiplication. Each current quantized per sequence is a DC quantity and does not change during digitization.

According to such an embodiment, the current polarity and thus the counting direction only changes in between the sequences. This allows use of an asynchronous charge counter circuit, in particular a fast asynchronous charge counter circuit. Also instead of digitizing and adding the result of each sequence the charge counter circuit may be designed according to embodiments such that the correct bit is incremented. This may save the need for high speed and area consuming counters.

FIG. 8a shows an exemplary input voltage/matrix value diagram illustrating a first approach for performing a matrix-vector multiplication. More particularly, the x-axis shows the matrix values G, the y-axis the input voltages u and the shaded areas show the applicable range of values of the first approach. According to the first approach the matrix values G are always positive, while the input voltages u may be positive as well as negative.

FIG. 8b shows an exemplary input voltage-matrix value diagram illustrating a second approach for performing a matrix-vector multiplication. More particularly, the x-axis shows the matrix values G, the y-axis the input voltages u and the shaded areas show the applicable range of values of the first approach. According to the second approach the matrix values G may be either positive or negative corresponding to positive or negative weights of the matrix. Furthermore, the input voltages u may be positive as well as negative.

This may be expressed e.g. by a formula as follows:

$$\begin{bmatrix} G_{11} & -G_{12} \\ -G_{21} & G_{22} \\ G_{31} & G_{32} \end{bmatrix} \times \begin{bmatrix} u_1 \\ -u_2 \end{bmatrix} \times V_{read} =$$

$$\left( \underbrace{\begin{bmatrix} G_{11} & 0 \\ 0 & G_{22} \\ G_{31} & G_{32} \end{bmatrix}}_{\text{Positive weight matrix}} \times \begin{bmatrix} u_1 \\ -u_2 \end{bmatrix} - \underbrace{\begin{bmatrix} 0 & G_{12} \\ G_{21} & 0 \\ 0 & 0 \end{bmatrix}}_{\text{Negative weight matrix}} \times \begin{bmatrix} u_1 \\ -u_2 \end{bmatrix} \right) \times V_{read} = \begin{bmatrix} q_1 \\ q_2 \\ q_3 \end{bmatrix}$$

According to the second approach positive and negative input voltage applications may happen for both weight matrices simultaneously. The demonstrated approach also works in the presence of negative weights in the matrix. These negative weights may be modeled in a separate crossbar. Positive and negative input applications may happen for both weight matrices simultaneously. The results, however, may be subtracted digitally from each other.

Figure 9:
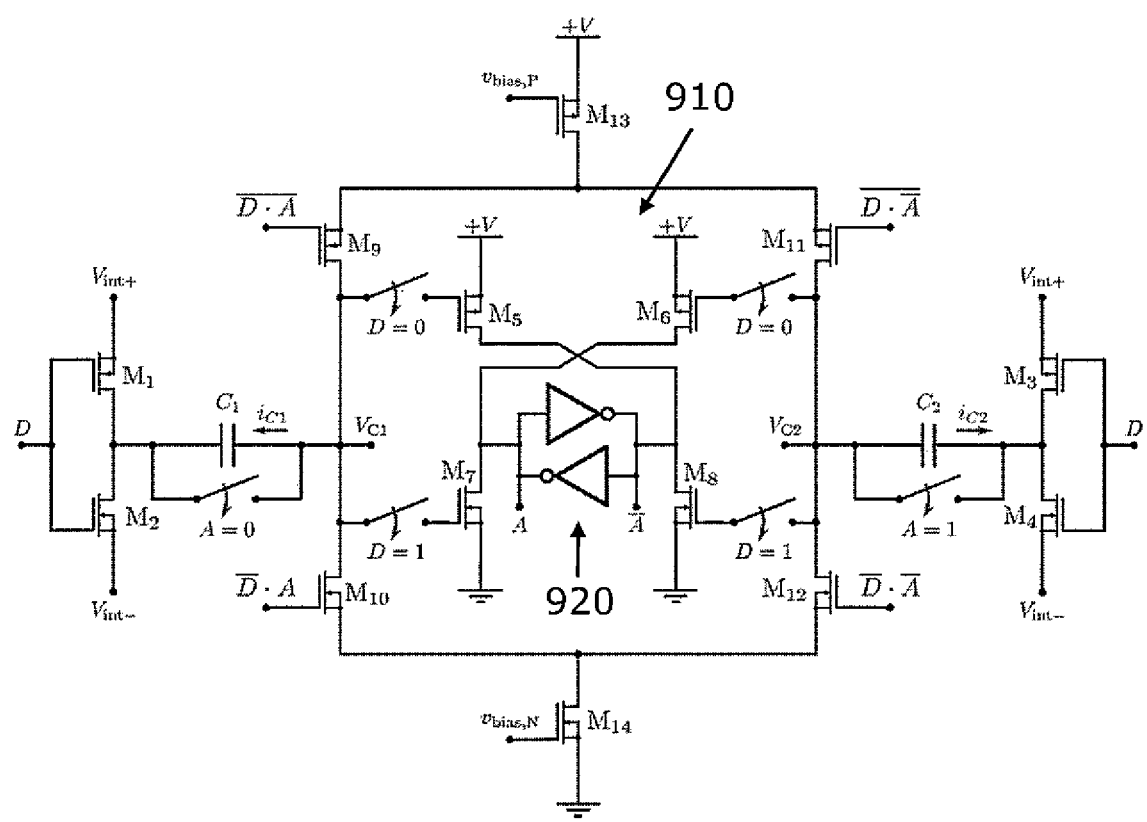
FIG. 9 shows a more detailed circuit implementation of a charge quantization circuit according to an exemplary embodiment.

FIG. 9 shows a more detailed circuit implementation of a charge quantization circuit 900. The charge quantization circuit 900 may be e.g. an exemplary implementation of the charge quantization circuit 770 of FIG. 7.

The charge quantization circuit 900 comprises a first integration capacitor $C_1$ and a second integration capacitor $C_2$. The voltage potential of the left electrode (bottom electrode) of the capacitor $C_1$ may be switched between a voltage $V_{int+}$ and a voltage $V_{int-}$ by means of transistors M1 and M2.

The voltage potential of the right electrode (bottom electrode) of the capacitor $C_2$ may be switched between the voltage $V_{int+}$ and the voltage $V_{int-}$ by means of transistors M3 and M4. The voltage $V_{int+}$ may be e.g. 0.75 V and the voltage $V_{int-}$ e.g. 0.25 V. The supply voltage +V may be e.g. 1 V. The first integration capacitor $C_1$ and the second integration capacitor $C_2$ may be charged by the column currents $i_{C_1}$ and $i_{C_2}$ respectively in an alternating manner. The charge quantization circuit 900 further comprises a cross coupled inverter 910 comprising transistors M5, M6, M7 and M8 as well as a cross coupled latch 920.

D denotes the sign of the column current which may be, e.g., provided by the comparator 730 as shown in FIG. 7. More particularly D=0 may correspond to a positive column current and D=1 to a negative column current or vice versa.

A denotes the output of the cross coupled latch 920 which may trigger a corresponding charge counter circuit, e.g. the charge counter circuit 780 as shown in FIG. 7.

In addition, transistors M9, M10, M11 and M12 are provided which are configured to receive different logical combinations of the signals D and A as control signals.

Furthermore, a transistor M13 is coupled to the supply voltage +V and receives an output signal $v_{bias, P}$ of a current mirror, e.g. of the current mirror 750 as shown in FIG. 7. In addition, a transistor M14 is coupled to ground and receives an output signal $v_{bias, N}$ of another current mirror, e.g. of the current mirror 755 as shown in FIG. 7.

Assuming a positive current I+ flowing into the crossbar column the signal D is set to 1 and a mirrored and scaled down version i+ is flowing from +V through M13 into the quantizer. Depending on the state A of the cross-coupled inverters this current is either integrated on the integration capacitors $C_1$ or $C_2$. The initial state of the integration capacitors and the voltage they are reset to is $V_{int-}$ This is because the transistors (NMOS devices) M7 and M8 turn on for a voltage bigger than $V_{trig} \approx (V_{int+}+V_{int-})/2$. Once the capacitor voltage $V_{C1}$ or $V_{C2}$ reaches $V_{trig}$ the cross-coupled inverters change their state A and the corresponding integration capacitor is reset while the current integration continues on the other integration capacitor.

Each change in A results in an incrementation/decrementation of the counter in the following stage. If the current flowing into the crossbar array becomes negative, the positive current I+ becomes zero and I− starts increasing, subsequently D becomes 0 and a scaled down current i− is sinked through M14 from the charge quantizer. The capacitor reset voltage is now set to $V_{int+}$ since now the transistors (PMOS devices) M5 and M6 are used to induce state changes in the cross coupled latch and changes happen for the voltages $V_{C1}$ or $V_{C2}$ being smaller than $V_{trig}$.

In summary the capacitor voltages $V_{C1}$ or $V_{C2}$ are increased from $V_{int-}$ to $V_{trig}$ for positive current flowing in the crossbar column and decreased from $V_{int+}$ to $V_{trig}$ for negative current.

If the current sign changes while integration is ongoing, a residue voltage $V_{residue}$ is added/subtracted to/from the integration start voltage, leading to an integration from $V_{int-}-V_{residue}$ to $V_{trig}$ for a sign change from positive to negative and an integration from $V_{int+}+V_{residue}$ to $V_{trig}$ for a sign change from negative to positive. In doing so the precision of the least significant bit (LSB) of the subsequent counting stage is improved.

Figure 10:
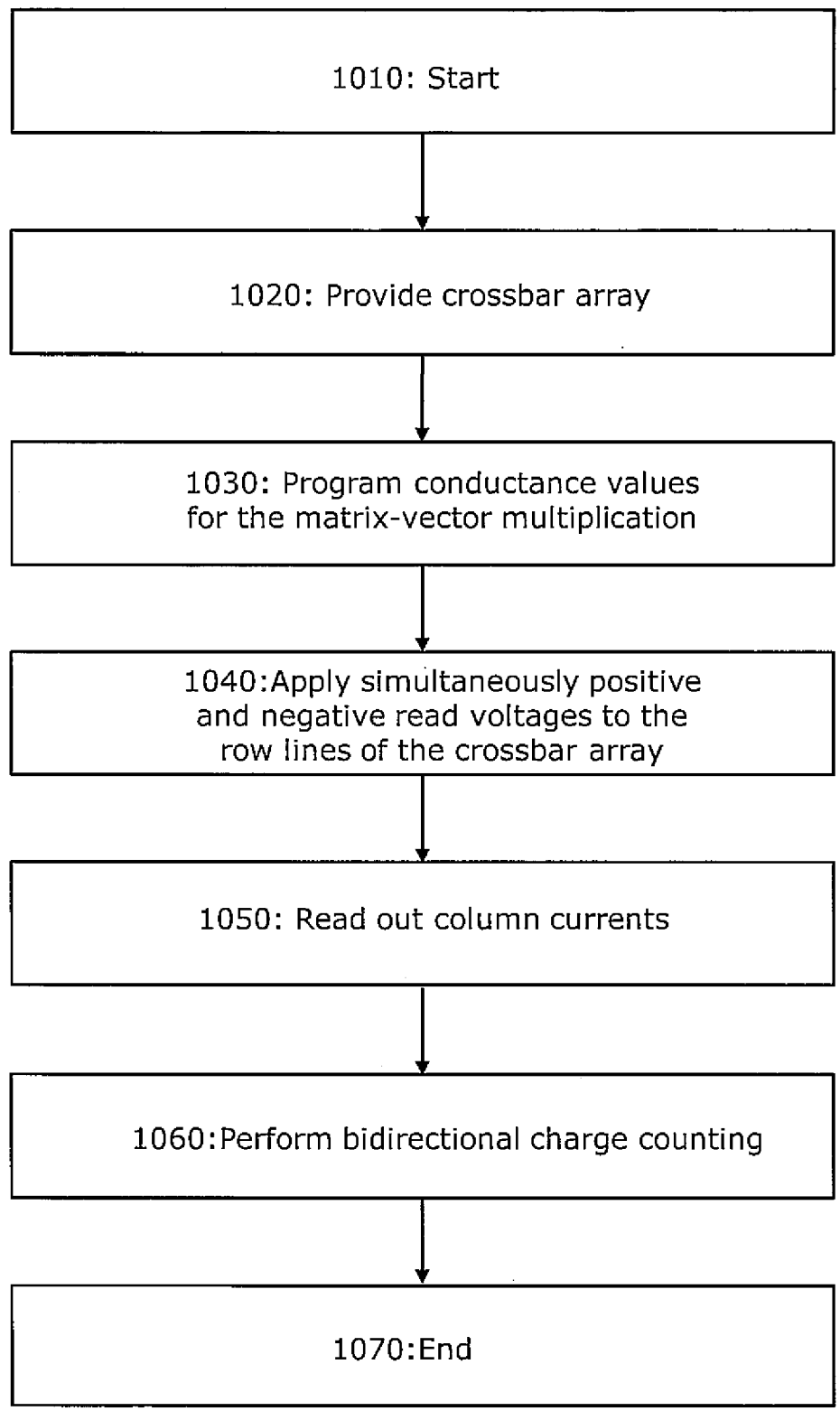
FIG. 10 shows a flow chart of a method for performing a matrix-vector multiplication of a matrix with a vector.

FIG. 10 shows a flow chart 1000 of methods steps of a method for performing a matrix-vector multiplication of a matrix with a vector.

At a step 1010, the method starts.

At a step 1020, a crossbar array is provided which comprises a plurality of row lines, a plurality of column lines and a plurality of junctions arranged between the plurality of row lines and the plurality of column lines. Each junction comprises a programmable resistive element and an access element for accessing the programmable resistive element.

At a step 1030, conductance values for the matrix-vector multiplication are programmed. This may be established by applying, by a signal generator, programming signals to the resistive elements of the crossbar array.

At a step 1040, the readout circuit applies simultaneously positive read voltages having a positive voltage sign and negative read voltages having a negative voltage sign to the row lines of the crossbar array.

At a step 1050, the readout circuit reads out column currents of the plurality of column lines of the crossbar array. The column currents may have a positive current sign corresponding to a positive current direction or a negative current sign corresponding to a negative current direction.

At a step 1060, the readout circuit performs a bidirectional charge counting of the current of the column lines in dependence on the sign of the column currents.

At a step 1070, the method ends.

Figure 11:
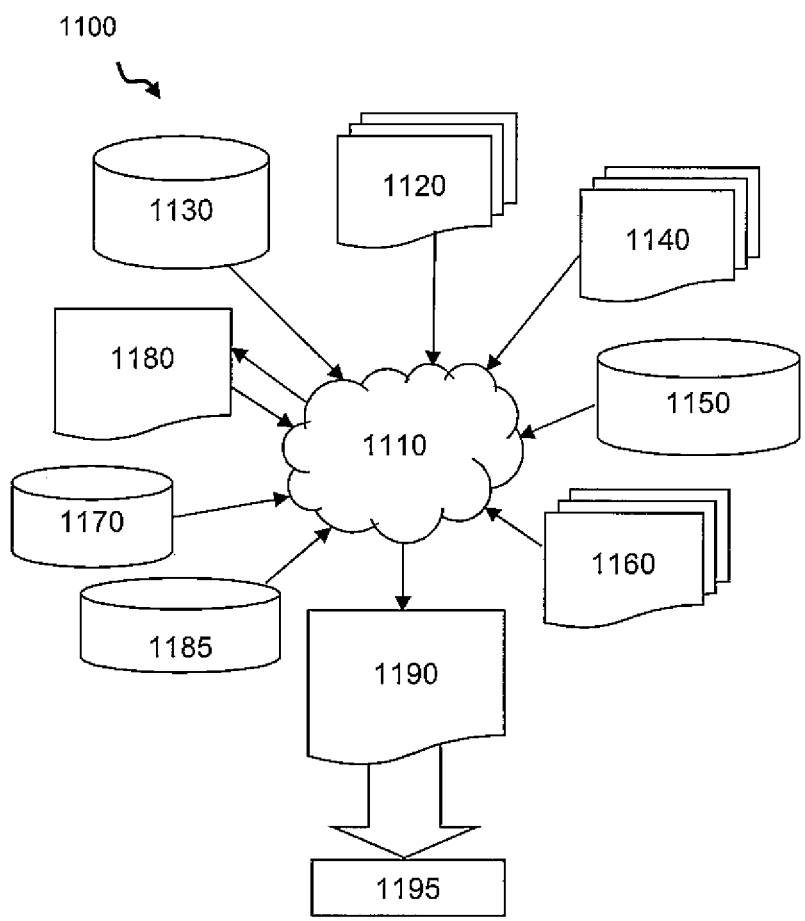
FIG. 11 shows a block diagram of an exemplary design flow.

FIG. 11 shows a block diagram of an exemplary design flow 1100 used for example, in semiconductor IC logic design, simulation, test, layout, and manufacture. Design flow 1100 includes processes, machines and/or mechanisms for processing design structures or devices to generate logically or otherwise functionally equivalent representations of the design structures and/or devices described above and shown e.g. in FIGS. 1-10. The design structures processed and/or generated by design flow 1100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1100 may vary depending on the type of representation being designed. For example, a design flow 1100 for building an application specific IC (ASIC) may differ from a design flow 1100 for designing a standard component or from a design flow 1100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1120 that is preferably processed by a design process 1110. Design structure 1120 may be a logical simulation design structure generated and processed by design process 1110 to produce a logically equivalent functional representation of a hardware device. Design structure 1120 may also or alternatively comprise data and/or program instructions that when processed by design process 1110, generate a functional representation of the physical structure of a hardware device. Whether representing functional and/or structural design features, design structure 1120 may be generated using electronic computer-aided design (ECAD) such as implemented by a core developer/designer. When encoded on a machine-readable data transmission, gate array, or storage medium, design structure 1120 may be accessed and processed by one or more hardware and/or software modules within design process 1110 to simulate or otherwise functionally represent an electronic component, circuit, electronic or logic module, apparatus, device, or system such as those shown in FIGS. 1-17. As such, design structure 1120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures shown in FIGS. 1-10 to generate a Netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which netlist 1180 is resynthesized one or more times depending on design specifications and parameters for the device. As with other design structure types described herein, netlist 1180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing a variety of input data structure types including Netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 1150, verification data 1160, design rules 1170, and test data files 1185 which may include input test patterns, output test results, and other testing information. Design process 1110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1110. Design process 1110 may also include modules for performing standard circuit design processes such as timing analysis, verification, design rule checking, place and route operations, etc.

Design process 1110 employs and incorporates logic and physical design tools such as HDL compilers and simulation model build tools to process design structure 1120 together with some or all of the depicted supporting data structures along with any additional mechanical design or data (if applicable), to generate a second design structure 1190. Design structure 1190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1120, design structure 1190 preferably comprises one or more files, data structures, or other computer-encoded data or instructions that reside on transmission or data storage media and that when processed by an ECAD system generate a logically or otherwise functionally equivalent form of one or more of the embodiments shown in FIGS. 1-17. In one embodiment, design structure 1190 may comprise a compiled, executable HDL simulation model that functionally simulates the devices shown in FIGS. 1-10.

Design structure 1190 may also employ a data format used for the exchange of layout data of integrated circuits and/or symbolic data format (e.g. information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 1190 may then proceed to a stage 1195 where, for example, design structure 1190: proceeds to tape-out, is released to manufacturing, is released to a mask house, is sent to another design house, is sent back to the customer, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A device for performing a matrix-vector multiplication of a matrix with a vector, the device comprising:
   a crossbar array comprising
      a plurality of row lines;
      a plurality of column lines;
   a plurality of junctions arranged between the plurality of row lines and the plurality of column lines, wherein each junction comprises a programmable resistive element and an access element for accessing the programmable resistive element;
   a signal generator configured to
      apply programming signals to the resistive elements to program conductance values for the matrix-vector multiplication;
   a readout circuit; and
   control circuitry configured to control the signal generator and the readout circuit; wherein the readout circuit is configured to
      apply positive read voltages having a positive voltage sign and negative read voltages having a negative voltage sign to the plurality of row lines of the crossbar array,
      read out column currents of the plurality of column lines of the crossbar array, the column currents having a positive current sign corresponding to a positive current direction or a negative current sign corresponding to a negative current direction; and
      perform a bidirectional charge counting of the column currents in dependence on the current direction of the column currents.

2. The device according to claim 1, wherein the readout circuit comprises
   a detection circuit configured to detect the instantaneous current direction of the column currents supplied to each column line of the plurality of column lines;
   a charge quantization circuit configured to perform a charge quantization of unit charges of the column currents of the plurality of column lines;

a charge counter circuit configured to perform a bidirectional counting of the unit charges being quantized by the charge quantization circuit.

3. The device according to claim 2, wherein the charge quantization circuit is a time-based current analog-to-digital converter.

4. The device according to claim 3, wherein
the time-based current analog-to-digital converter is configured to emit a pulse on detection of a unit charge; and
provide the pulse to the charge counter circuit.

5. The device according to claim 2, wherein
the charge quantization circuit is configured to perform a plurality of charge/decharge cycles of one or more integration capacitors;
the charge counter circuit is configured to count the plurality of charge/decharge cycles of the one or more integration capacitors.

6. The device according to claim 2, wherein the charge quantization circuit comprises
a first unit charge quantizer for quantifying unit charges in the positive current direction; and
a second unit charge quantizer for quantifying unit charges in the negative current direction.

7. The device according to claim 1, wherein the readout circuit is configured to apply the read voltages as pulse width modulated signals to the row lines of the crossbar array.

8. The device according to claim 7, wherein the readout circuit comprises a synchronous bidirectional charge counter circuit.

9. The device according to claim 1, wherein the read voltages are applied as binary read pulse vectors to the row lines of the crossbar array.

10. The device according to claim 9, wherein the readout circuit comprises an asynchronous charge counter circuit.

11. The device according to claim 1, wherein the device comprises a read voltage regulation circuit configured to supply the column currents having a positive current sign as well as the column currents having a negative current sign to the crossbar array.

12. The device according to claim 11, wherein the device is configured to use a control output of the read voltage regulation circuit to detect the sign of the column currents flowing into each column line of the plurality of column lines.

13. The device according to claim 11, wherein the read voltage regulation circuit comprises
a class AB amplifier stage;
a first current mirror; and
a second current mirror.

14. The device as claimed in claim 1, wherein the resistive elements are one of Phase change memory (PCM) elements, Conductive bridge resistive memory elements, Metal-oxide resistive random access memory (RRAM) elements, Magneto-resistive random access memory (MRAM) elements, Ferroelectric random access memory (FeRAM) elements, optical memory elements, and a system device, comprising transistors, resistors, capacitors, and/or inductors, jointly emulating a behavior of a resistive memory element.

15. The device according to claim 1, wherein the signal generator is configured to program the conductance values of the resistive elements by an iterative program and verify procedure.

16. A method for performing a matrix-vector multiplication of a matrix with a vector, the method comprising
providing
a crossbar array comprising
a plurality of row lines;
a plurality of column lines;
a plurality of junctions arranged between the plurality of row lines and the plurality of column lines, wherein each junction comprises a programmable resistive element and an access element for accessing the programmable resistive element;
applying, by a signal generator, programming signals to the resistive elements, thereby programming conductance values for the matrix-vector multiplication;
applying, by a readout circuit, simultaneously positive read voltages having a positive voltage sign and negative read voltages having a negative voltage sign to the row lines of the crossbar array;
reading out, by the readout circuit, column currents of the plurality of column lines of the crossbar array, the column currents having a positive current sign corresponding to a positive current direction or a negative current sign corresponding to a negative current direction; and
performing, by the readout circuit, a bidirectional charge counting of the current of the column lines in dependence on the sign of the column currents.

17. A design structure tangibly embodied in a non-transitory machine readable medium for designing, manufacturing, or testing an integrated circuit, the design structure comprising a device for performing a matrix-vector multiplication of a matrix with a vector, the device comprising:
a crossbar array comprising
a plurality of row lines;
a plurality of column lines;
a plurality of junctions arranged between the plurality of row lines and the plurality of column lines, wherein each junction comprises a programmable resistive element and an access element for accessing the programmable resistive element;
a signal generator configured to
apply programming signals to the resistive elements to program conductance values for the matrix-vector multiplication;
a readout circuit; and
control circuitry configured to control the signal generator and the readout circuit;
wherein the readout circuit is configured to
apply positive read voltages having a positive voltage sign and negative read voltages having a negative voltage sign to the plurality of row lines of the crossbar array;
read out column currents of the plurality of column lines of the crossbar array, the column currents having a positive current sign corresponding to a positive current direction or a negative current sign corresponding to a negative current direction; and
perform a bidirectional charge counting of the column currents in dependence on the current direction of the column currents.

18. The design structure according to claim 17, wherein the readout circuit comprises
a detection circuit configured to detect the instantaneous current direction of the column currents supplied to each column line of the plurality of column lines;
a charge quantization circuit configured to perform a charge quantization of unit charges of the column currents of the plurality of column lines;

a charge counter circuit configured to perform a bidirectional counting of the unit charges being quantized by the charge quantization circuit.

19. The design structure according to claim 17, wherein the charge quantization circuit is a time-based current analog-to-digital converter.

20. The design structure according to claim 17, wherein the time-based current analog-to-digital converter is configured to emit a pulse on detection of a unit charge; and provide the pulse to the charge counter circuit.

\* \* \* \* \*